(12) United States Patent
Becker

(10) Patent No.: US 7,123,059 B2
(45) Date of Patent: Oct. 17, 2006

(54) OUTPUT STAGE RESISTANT AGAINST HIGH VOLTAGE SWINGS

(75) Inventor: Rolf F. P. Becker, Adliswil (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 35 days.

(21) Appl. No.: 10/515,733

(22) PCT Filed: May 23, 2003

(86) PCT No.: PCT/IB03/01981

§ 371 (c)(1),
(2), (4) Date: Nov. 24, 2004

(87) PCT Pub. No.: WO03/103145

PCT Pub. Date: Dec. 11, 2003

(65) Prior Publication Data
US 2005/0189966 A1    Sep. 1, 2005

(30) Foreign Application Priority Data
May 31, 2002   (EP) .................................. 02012059

(51) Int. Cl.
*H03K 3/00* (2006.01)

(52) U.S. Cl. ........................ 327/108; 327/318; 327/319

(58) Field of Classification Search ........ 327/108–112, 327/310, 318, 319; 326/23, 27
See application file for complete search history.

(56) References Cited

U.S. PATENT DOCUMENTS 5,889,420 A * 3/1999 Poechmueller .............. 327/108
6,107,829 A    8/2000 Martin

FOREIGN PATENT DOCUMENTS

JP   11 330942    11/1999
JP   2000 228628   8/2000

* cited by examiner

*Primary Examiner*—Kenneth B. Wells
(74) *Attorney, Agent, or Firm*—Aaron Waxler; Paul Im

(57) ABSTRACT

Circuit comprising a signal input (11) for receiving an input signal (s(t)) and a digital output stage (15) being designed for operation at a supply voltage ($V_{DD}$). The output stage (15) comprises a series of two n-channel CMOS transistors (no1, no2), a common node (17) between the two n-channel CMOS transistors (no1, no2), and an output port (16). Active voltage limiting means (14) are arranged between the signal input (11) and the common node (17) for limiting voltages ($V_{NM}$) at the common node (17) to a voltage limit ($V_{max}$). The voltage limiting means (14) are controllable byte state of the input signal (s(t)).

10 Claims, 4 Drawing Sheets

US 7,123,059 B2

OUTPUT STAGE RESISTANT AGAINST HIGH VOLTAGE SWINGS

The present invention relates to output stages having an improved protection against voltage swings. In particular, the present invention relates to digital output stages and their protection.

While modern CMOS IC (complementary metal oxide semiconductor integrated circuit) fabrication technologies are going down with critical geometrical dimensions, the maximum allowed voltage swing across individual transistors and with it the maximum allowed supply voltage is going down rapidly. On the other hand the signal swing at an output port of a CMOS device must for compatibility reasons go beyond these voltage limits.

A solution to this problem presently is to enhance the CMOS fabrication process by processing steps, which allow the fabrication of transistors capable of working at higher voltage swings. This on one hand requires additional and costly fabrication steps and on the other hand calls for an additional supply domain and level shifters to accommodate to the voltage swing internal to the integrated circuit.

In particular in modern submicron CMOS processes the maximum supply voltage $V_{DDmax}$ is determined by reliability considerations for the application of transistors in standard digital gates. The requirement is that any voltage difference across the transistor nodes does not go beyond a certain limit $V_{max}$. The FIG. 1 shows the relevant voltages of an n-channel transistor 1 with $V_{GS}$, $V_{DS}$, $V_{GD} < V_{max}$, for example. For digital gates this requires $V_{max}$ to be the maximum allowed supply voltage of the whole chip of which the transistor is a part. Note that the voltage towards bulk is not limited to the same extent.

For signal processing this requires the signal swing to stay within the limits posed by the maximum allowed supply voltage. With supply voltages going down further with the advance of smaller geometry this has a severe impact on the accommodation of signal swings at the input ports of a circuit, which in many cases go beyond $V_{max}$.

A state of the art digital output stage typically comprises two inverters being supplied by the chip supply voltage $V_{DD}$. Electrostatic discharge (ESD) protection elements are provided at the circuit's output. ESD protection is employed in order to prevent the very sensitive output stage from being destroyed when it is subjected to a discharge event. This might happen for example when somebody induces a voltage peak into the circuitry by touching the pins of the chip. In general $V_{DD}$ would be close to $V_{max}$. In case a high voltage input signal inside the output stage going beyond the limits of $V_{max}$ dictated by the fabrication technology is applied, the voltage at the output node would go above the limit, leading to destruction or at least severe life time reduction.

As mentioned above, one possible solution to the problem is to add fabrication steps to produce circuit elements which are able to withstand higher voltages. FIG. 2 shows a corresponding example. A standard digital output stage 2 of the so-called push-pull type is given in FIG. 2. An output stage 2 with ESD protection elements D1 and D2 is shown. In this case transistors nd, no, pd, and po of the output stage 2 are special elements being designed to cope with voltages higher than $V_{max}$ by special and expensive process steps. Note that an additional supply domain $V_{DDH}$ and a level shifter 5 is required in order to shift the voltages to the lower levels of the $V_{DD}$ voltage domain. The voltage $V_{DDH}$ can go as high as two times $V_{max}$. The voltage $V_{DD}$ is the normal supply voltage of the transistors of the inverter I1. $V_{DD}$ is less than or equal to $V_{max}$. For the design shown in FIG. 2, the transistors nd, no, pd, po and the level shifter 5 require special and expensive fabrication steps to be able to withstand a voltage that is higher than $V_{max}$. This can for example be achieved by providing for transistors having an increased channel length and an increased gate oxide thickness.

Various circuits with output stages are addressed in the Japanese Patent applications with publication numbers 2000-228628 and 11-330942. The disclosed output stages comprise a series of two transistors having a common node. This common node is floating and can under certain circumstances take on potentials that may lead to a destruction of the transistors.

It is an object of the present invention to provide circuits that avoid or reduce the drawbacks of conventional devices, and to provide devices based on such circuits.

It is another object of the present invention to provide devices with an improved resistance against voltage swings at their output.

It is another object of the present invention to provide open-drain output stage with an improved resistance against voltage swings.

It is another object of the present invention to provide push-output stages with an improved resistance against voltage swings.

These and other objects are accomplished by a circuit according to claim 1. Such a circuit comprises a signal input for receiving an input signal and a digital output stage being designed for operation at a supply voltage. The output stage comprises a series of two n-channel CMOS transistors, a common node between the two n-channel CMOS transistors, and an output port. Active voltage limiting means are arranged between the signal input and the common node for limiting voltages at the common node to a voltage limit ($V_{max}$). The voltage limiting means are controllable by the state of the input signal.

The present invention allows to realize circuits with reduced fabrication technology costs and less complex system design.

Further advantageous implementations are claimed in claims 2–10.

For a more complete description of the present invention and for further objects and advantages thereof, reference is made to the following description, taken in conjunction with the accompanying drawings, in which.

The various embodiments are based on the finding that a floating common node between transistors might lead to situations where the voltage across the transistor node pairs goes beyond the maximum voltage for which the transistors are designed. As a next step, it has been recognized that a simple static fixation of the common node is not sufficient to properly protect the transistors. Critical states can only be prevented by providing a controlled potential at the common node. According to the present invention, an active voltage limiting means is provided that allows the required control of the potential. More details of the present invention are addressed in connection with various embodiments.

Figure 1:
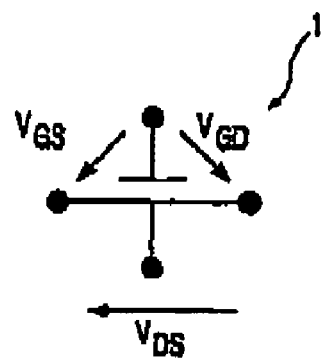
FIG. 1 is a schematic representation of a conventional n-channel transistor.
Figure 2:
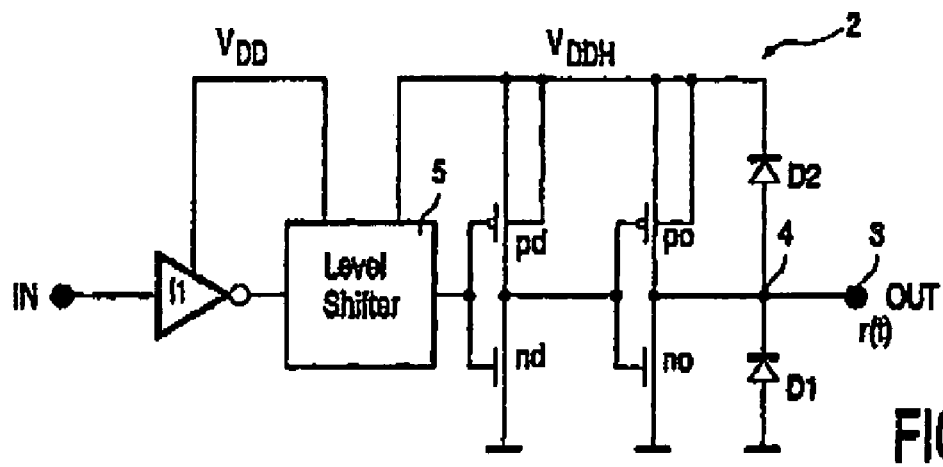
FIG. 2 is a schematic representation of a conventional digital output stage designed to cope with high input voltages.
Figure 3:
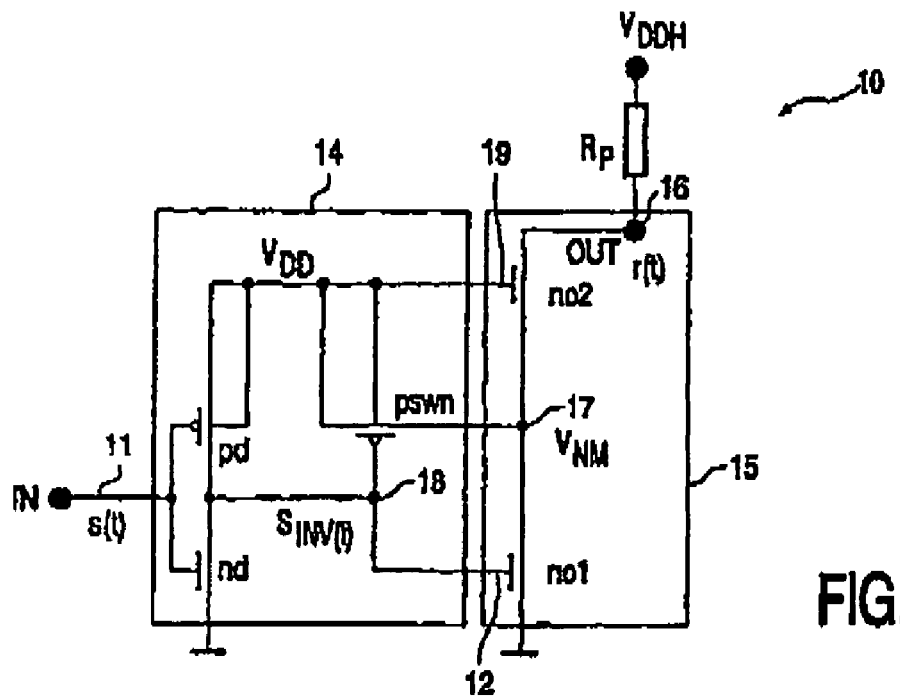
FIG. 3 is a schematic representation of a first embodiment according to the present invention.

A first embodiment is illustrated in FIG. 3. A circuit 10 is shown that comprises a signal input 11 (IN) for receiving a digital input signal s(t), and a digital output stage 15 being designed for operation at a supply voltage $V_{DD}$. The circuit 10 may be the n-channel part of an output stage of an integrated circuit (IC) chip, for example. The output stage 15 comprises several CMOS transistors no1, no2, and an input 18. In the present example the output stage 15 comprises a series of two n-channel CMOS transistors no1, no2. The output stage 15 has an open-drain output 16 with an external pull-tip resistor $R_p$. The pull-up resistor $R_p$ pulls the drain 16 of the transistor no2 to the hitch voltage $V_{DDH}$. The transistors no1, no2 are sensitive to voltages across their nodes going beyond a voltage limit $V_{max}$. In order to protect the digital output stage 15 against high voltage across their node pairs, voltage limiting means 14 are arranged between the signal input 11 (IN) and the output stage 15. The voltage limiting means 14 limit the voltage $V_{NM}$ at the common node 17 to the supply voltage $V_{DD}$. In order to be able to achieve this, the voltage limiting means 14 comprise an output switch (pswn) being controllable by the state of the input signal s(t). To make the whole block diagram of FIG. 3 simpler, the ESD protection elements (e.g., diodes D1 and D2 as in FIG. 2) are not shown.

By having two n-channel driver transistors no1 and no2 in series, as depicted in FIG. 3, provided that the active voltage limiting means 14 are designed accordingly, each of the two transistors no1 and no2 is only subjected to a maximum voltage $V_{DD}$ across each of its node pairs. The transistor no2 is permanently turned on by connecting its gate 19 to the voltage $V_{DD}$. The transistor no1, however, is switched (controlled) by the inverted input signal $s_{INV}(t)$. If both transistors no1 and no2 are turned on, the voltage at the output 16 is close to zero volt and the gates 19 and 12 are connected to $V_{DD}$, which is a safe state. When the transistor no1 is turned off, the output 16 moves to $V_{DDH}$. In this case, the voltage $V_{NM}$ at the common node 17 is switched to $V_{DD}$ via the switch transistor pswn that is part of the voltage limiting means 14. The switch transistor pswn ensures that the voltages between all node pairs of the transistors no1 and no2 of the output stage 15 stay within safe limits.

It is an advantage of this embodiment that only standard elements are being using. The structure presented in FIG. 3 is sufficient to protect the output stage 15 against high voltages beyond $V_{max}$.

Note that the supply domain $V_{DDH}$ does not have to be available on the chip itself, since pull-up resistor $R_p$ serves as level shifter.

Figure 4:
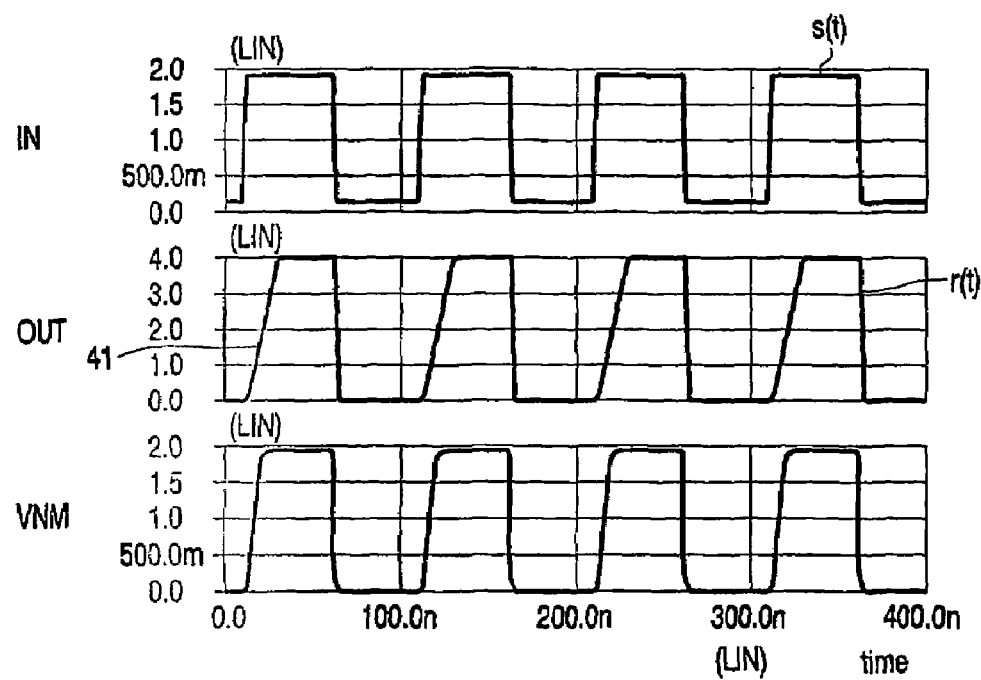
FIG. 4 is a diagram depicting the different voltages at the nodes of a circuit, according to the present invention.

The operation of the circuit 10 depicted in FIG. 3 is explained in connection with the diagrams given in FIG. 4. In all these examples, the supply voltage $V_{DD}=V_{max}$ is set to 2 Volt and $V_{DDH}=$is set to 4 Volts. In FIG. 4 the signal swing of the signal s(t) is 2 Volts. The diagram at the top depicts the voltage swings of the digital signal s(t). The signal r(t) at the output 16 is illustrated in the middle of FIG. 4. The signal r(t) reaches 4 Volts. The voltage $V_{NM}$, however, stays below 2 Volts. That is, the voltage across the node pairs of the transistors no1 and no2 stays within the critical limits.

Figure 5:
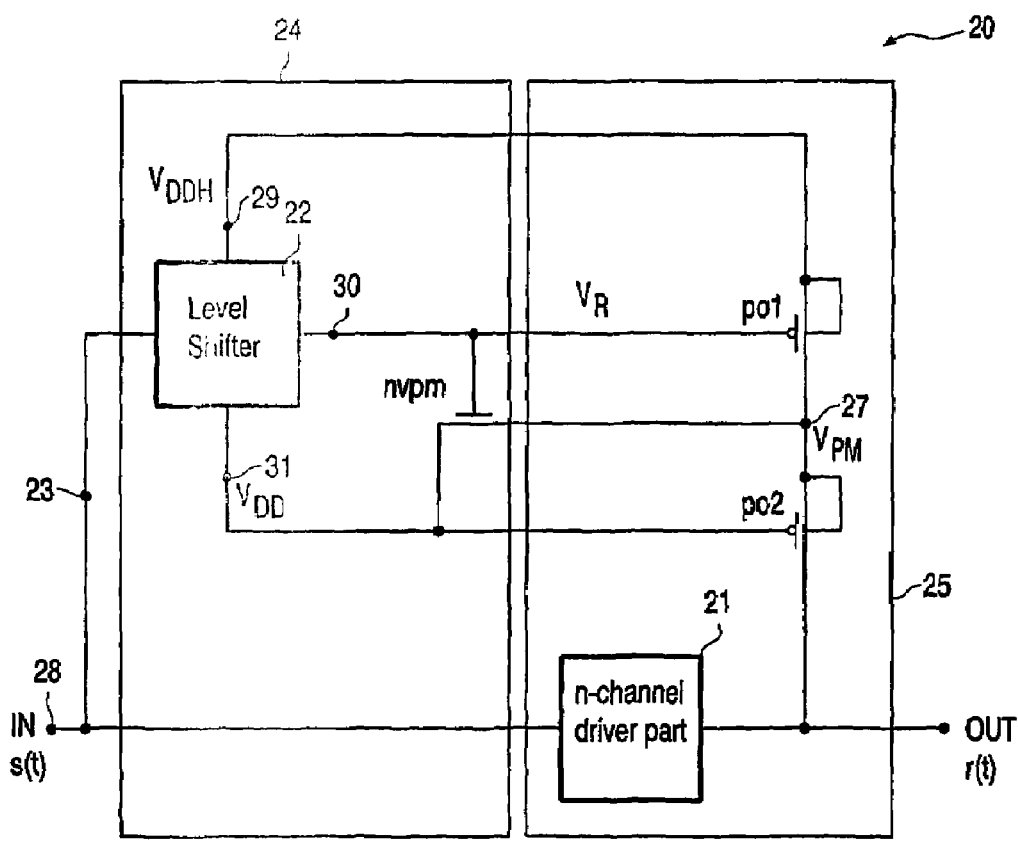
FIG. 5 is a schematic representation of a second embodiment according to the present invention.

A draw-back of an open-drain output stage (like the one presented in FIG. 3) is that the output signal r(t) has slowly rising edges 41. To have the full functionality of a push-pull-output stage as given in FIG. 2, a driver for the p-channel output transistor (transistor po in FIG. 2) must be added. A possible implementation of such a output stage with driver is described in connection with FIG. 5. The circuit 20 in FIG. 5 comprises a digital output stage 25 and an n-channel driver part 21. The stage 25 comprises two p-channel CMOS transistors po1 and po2 being connected in series. When the common node 27 between the transistors po1 and po2 is left floating, the voltages across the transistor node pairs can take on voltages that go beyond $V_{max}$ and thus might destroy the transistors. Similar voltage limiting means 24 are used as in FIG. 3 to actively limit the drive voltage of the transistor po2 to $V_{DD}$. The voltage limiting means 24 allow the voltage at the common node 27 to be kept at or below $V_{DD}$ even when the output signal r(t) is low. This is, according to the present invention, accomplished by an n-channel switch nvpm in combination with a level shift 22. A problem is that the gate voltage $V_R$ for the active device po1 must be referred to $V_{DD}$ and thus be generated by the level shifter 22 from the input signal s(t). For this reason, the input 23 of the level shifter 22 is connected to the input 28. In additional, the level shifter 22 is connected $V_{DDH}$ at a port 29. The level shifter 22 provides the gate voltage $V_R$ at the output 30 and is connected to the voltage $V_{DD}$ at node 31.

Figure 6:
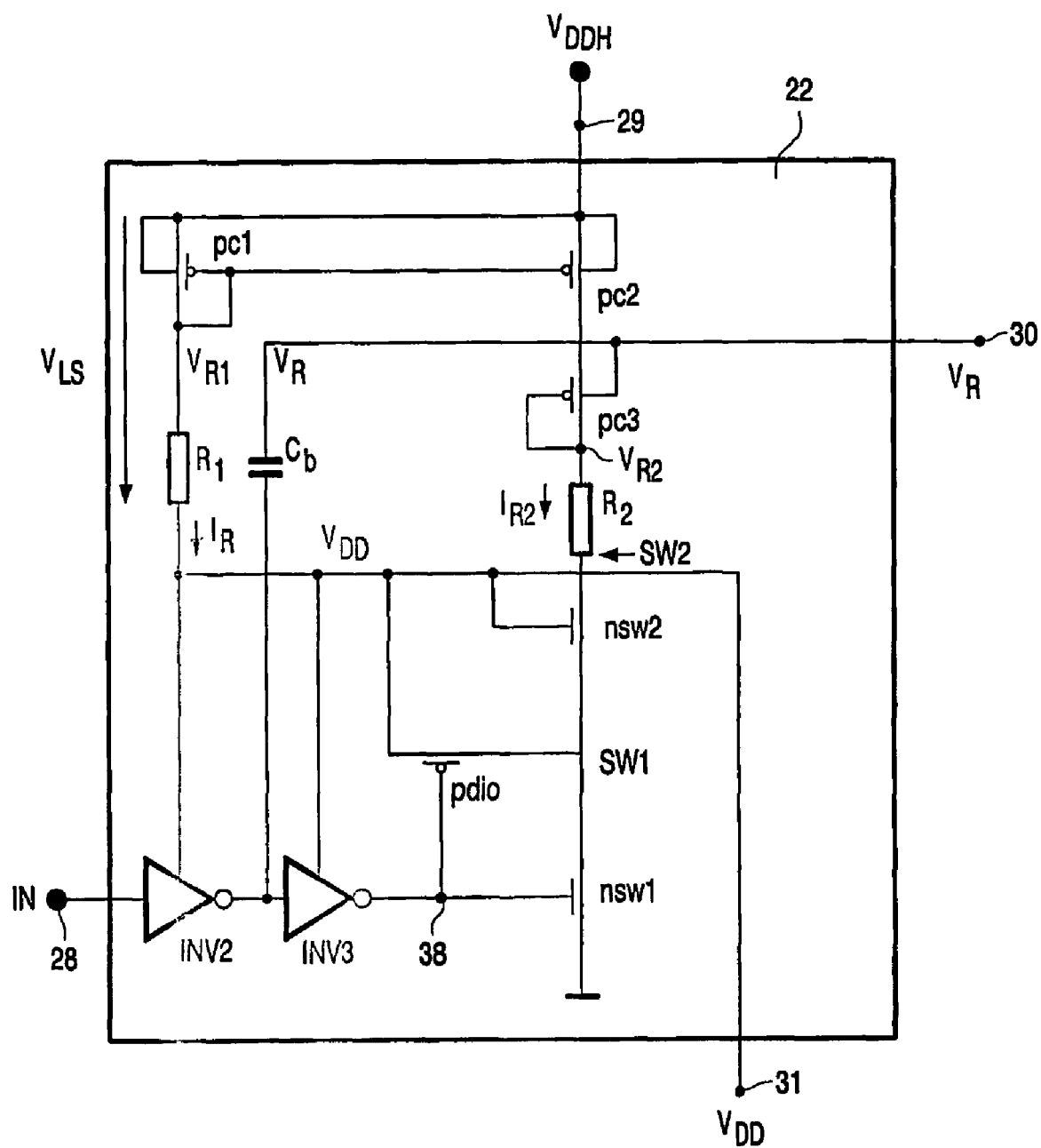
FIG. 6 is a schematic representation of a level shifter according to the present invention.

One possible implementation of a level shifter 22 in accordance with the present invention is illustrated in FIG. 6. The level shifter 22 operates in the following way. In a first step, the voltage difference $V_{LS}=V_{DDH}-V_{DD}$ is transformed into a current $I_R$. This information is carried out by the transistor pc1 and the resistor $R_1$. The transistor pc1 and the resistor $R_1$ are arranged so that they measure the voltage difference $V_{LS}=V_{DDH}-V_{DD}$. The current $I_R$ is mirrored by the transistors pc2 and pc1 into a current $I_{R2}$ that flows through the transistor pc3 and resistor $R_2$, when the transition nsw1 is turned on. If pc2 and pc3 have the same geometry as pc1, and if $R_2$ has the same resistor value as $R_1$, then the voltage between the nodes 30 and SW2 is $V_{LS}=V_{DDH}-V_{DD}$, but referred to ground. In this state the transistor po1 is turned on. When the transistor nsw1 is switched off, the current through the transistor pc3 stops and the node 30 is pulled to $V_{DDH}$ thus shutting off the transistor po1. The level shifter 22 provides for a replication of the voltage $V_{LS}$.

According to the present invention, the series connection of the transistors nsw1 and nsw2 together with the transistor pdio keeps the voltages across all transistor node pairs below or equal to $V_{max}$. The transistor po1 is actively driven, according to the present invention. The gate of the transistor po1 is switched with respect to $V_{DDH}$ instead of ground. The level shifter 22 is realized such that it controls the game voltage $V_R$ of the transistor po1.

The level shifter 22 comprises an auxiliary circuit consisting of the transistor pdio and an inverter INV3. The auxiliary circuit protects the transistors nsw1, nsw2 in the same manner as described in connection with FIG. 3. The inverter INV3 control the transistors nsw1, pdio. The potential at the common node SW1 between the two transistors nsw1, nsw2 is kept at values below $V_{max}$.

It is a drawback of the implementation given in FIG. 6 that the current $I_R$ is constantly flowing. This current $I_R$ is required to be inconveniently high in order to be able to the node 30 for high speed operation. This drawback can be circumvented by adding boot-strap capacitor $C_b$. Note that this boot-strap capacitor $C_b$ is optional. The capacitor $C_b$ allows a faster switching of the transistor po1. When using the boot-strap capacitor $C_b$ the current can be low (in the range of µA) because it is just required to pre-charge the node 30 once to a proper value when the input signal s(t) at the input 28 is at "1". The dynamic behavior is then determined by the boot-strap capacitor $C_b$.

As a consequence, the power consumption of the whole circuit is reduced.

Figure 7:
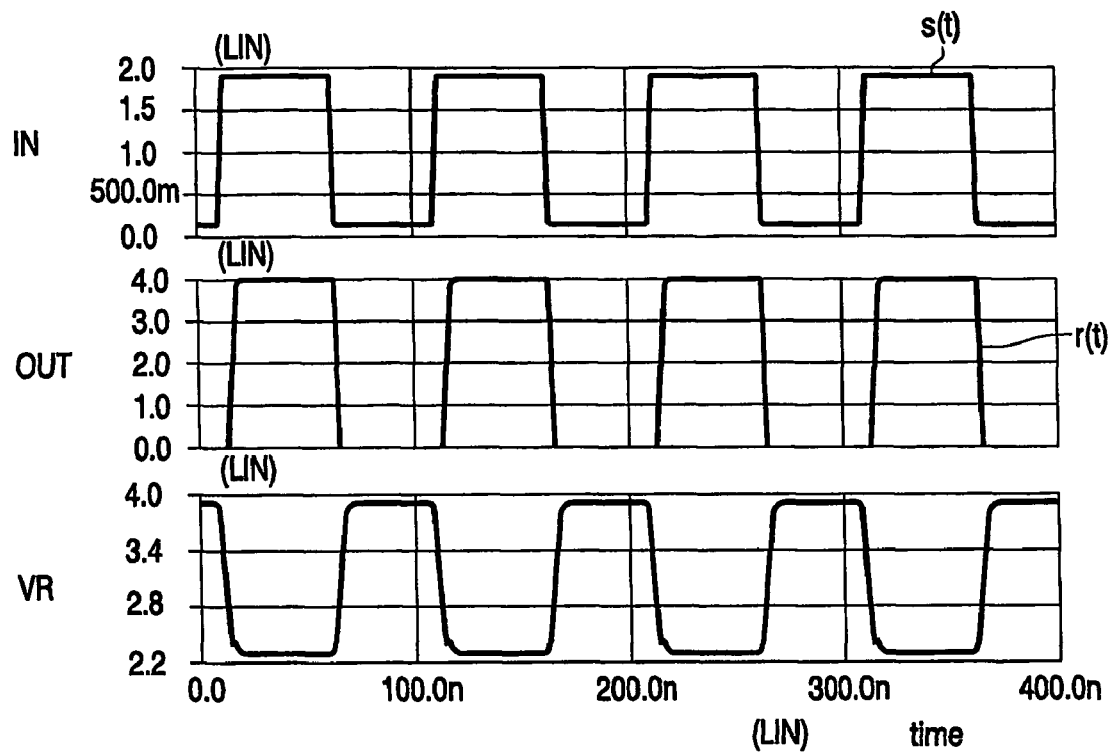
FIG. 7 is a diagram depicting the different voltages at the nodes of a circuit, according to the present invention.
Figure 8:
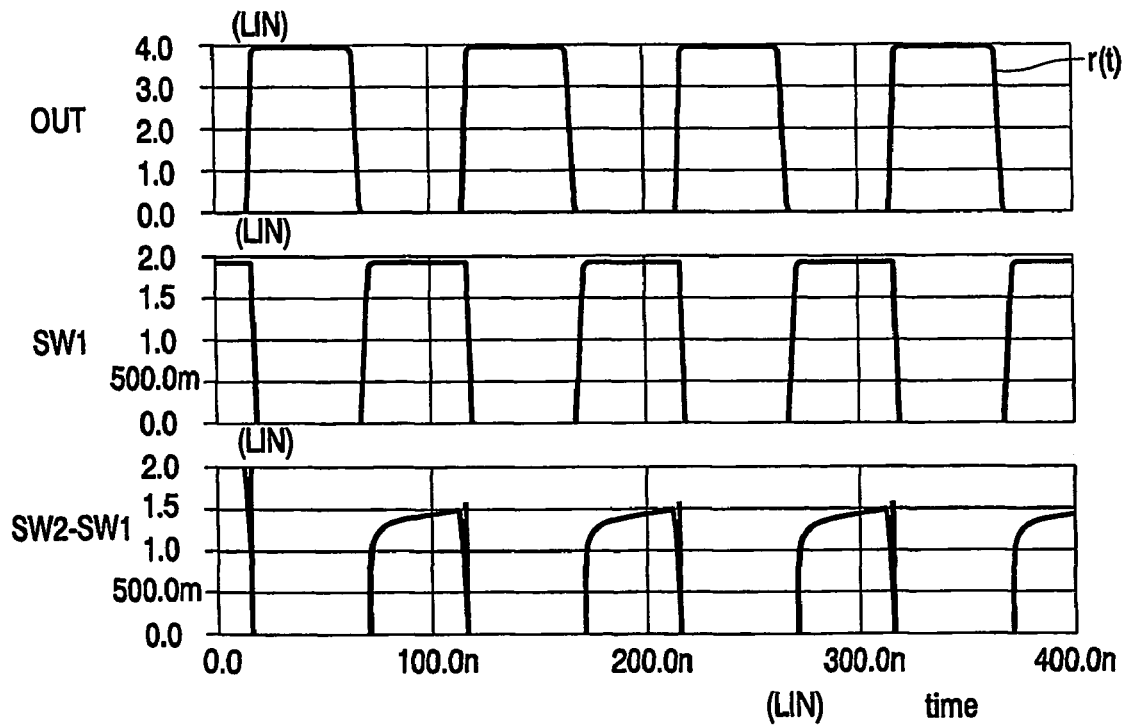
FIG. 8 is a diagram depicting the different voltages at the nodes of a circuit, according to the present invention.

In FIG. 7, the signal swings of the signals s(t), r(t) and $V_R$ are shown. FIG. 8 shows the voltage at the internal node SW1 and the difference between the nodes SW2 and SW1, i.e., the voltage across the drain and source of the transistor nsw2. In these two Figures, the voltages are as follows: $V_{DDH}=4V$ and $V_{DD}=V_{max}=2V$. It can be seen that the voltages across the node pairs of all transistors is kept below the limit $V_{max}$.

The various embodiments may comprise means for over-voltage protection to further improve the protection of the output stage 25.

Various circuits are presented herein, which allow digital output pads to comply with voltages up to 2 times the maximum allowed voltage across one transistor for a given fabrication technology. According to the present invention, standard devices are employed without the need for:

an additional high voltage supply domain,
level shifter to bridge the two supply domains,
additional fabrication process steps, to provide transistors, which withstand high voltages.

The present scheme can be used to protect CMOS (complementary metal oxide semiconductor) and BiCMOS circuits (bipolar devices combined with CMOS subcircuits on a single chip), for example.

In the drawings and specification there has been set forth preferred embodiments of the invention and, although specific terms are used, the description thus given uses terminology in a generic and descriptive sense only and not for purposes of limitation.

The invention claimed is:

1. Circuit comprising
    signal input (11) for receiving an input signal (s(t)),
    a digital output stage (15) being designed for operation at a supply voltage ($V_{DD}$), the output stage (15) comprising
        a series of two n-channel CMOS transistors (no1, no2; nsw1, nsw2) sensitive to voltages across transistor node pairs going beyond a voltage limit ($V_{max}$),
        a common node (17; SW1) between the two n-channel CMOS transistors (no1, no2; nsw1, nsw2),
        an output port (16),
        active voltage limiting means (14; INV3, pdio) being arranged between the signal input (11) and the common node (17; SW1) for limiting voltages ($V_{max}$) at the common node (17; SW1) to the voltage limit ($V_{max}$), the voltage limiting means (14; INV2, pdio) being controllable by the state of the input signal (s(t)) and comprising a plurality of transistors (pd, nd, pswn; INV3, pdio) for providing a limited and stable output voltage ($V_{NM}$) at the common node (17; SW1), wherein one of the plurality of transistors is a p-channel CMOS transistor (pswn; pdio) serving as switch, the gate (18; 38) of the p-channel CMOS transistor (pswn; pdio) being controlled by the state of a signal derived from the input signal (s(t)).

2. The circuit of claim 1, wherein two of the plurality of transistors (pd, nd) are arranged as inverter for inverting the input signal (s(t)) in order to apply an inverted signal ($s_{vn}(t)$) to a gate (18; 38) of the p-channel CMOS transistor (pswn; pdio) that serves as switch.

3. The circuit of claim 2, comprising a pull-up resistor ($R_p$) being situated between the output port (16) and a node that is kept at a higher voltage ($V_{DDH}$) that is greater than the supply voltage ($V_{DD}$), the pull-up resistor ($R_p$) being provided to pull the drain (16) of one of the two n-channel CMOS transistors (no2) to the higher voltage ($V_{DDH}$).

4. The circuit of claim 1 or 2, comprising a p-channel driver part with at least two p-channel CMOS transistors (po1, po2) arranged in series.

5. The circuit of claim 1 or 2, comprising a level shifter (22) providing for a voltage ($V_R$) that is lower than the voltage limit ($V_{max}$).

6. The circuit of claim 1 or 2, comprising speed boost means having at least one capacitive element ($C_b$) speeding up the turn-on/turn-off behavior of one of the CMOS transistors (no1, no2; nsw1, nsw2; po1, po2).

7. The circuit of claim 6, wherein the charging of the capacitive element ($C_b$) depends on the state of a signal derived from the input signal (s(t)).

8. The circuit of claim 1 or 2 being made using a submicron fabrication process, preferably a deep submicron fabrication process.

9. Open-drain output stage comprising a circuit in accordance with one of the claims 1 or 2.

10. Push-pull-output stage comprising a circuit in accordance with one of the claims 1 or 2.

* * * * *